(12) United States Patent
Lin et al.

(10) Patent No.: US 10,942,553 B2
(45) Date of Patent: Mar. 9, 2021

(54) DISPLAY DEVICE

(71) Applicant: ASUSTeK COMPUTER INC., Taipei (TW)

(72) Inventors: Yu-Sheng Lin, Taipei (TW); Yaw-Huei Chiou, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/689,232

(22) Filed: Nov. 20, 2019

(65) Prior Publication Data

US 2020/0174539 A1 Jun. 4, 2020

(30) Foreign Application Priority Data

Nov. 30, 2018 (TW) .................................. 10721637.8

(51) Int. Cl.
*H05K 5/00* (2006.01)
*G06F 1/26* (2006.01)
*H05K 5/02* (2006.01)

(52) U.S. Cl.
CPC ........... *G06F 1/266* (2013.01); *H05K 5/0017* (2013.01); *H05K 5/0234* (2013.01)

(58) Field of Classification Search
CPC .... G06F 1/266; H05K 5/0017; H05K 5/0234; H05K 5/00; H05K 5/02
See application file for complete search history.

(56) References Cited

U.S. PATENT DOCUMENTS

2018/0067885 A1  3/2018 Hsieh et al.

FOREIGN PATENT DOCUMENTS

| CN | 204668678 U | 9/2015 |
| CN | 105608035 A | 5/2016 |
| CN | 107809122 A | 3/2018 |
| TW | M540418 U | 4/2017 |

*Primary Examiner* — Robert L Deberadinis
(74) *Attorney, Agent, or Firm* — McClure, Qualey & Rodack, LLP

(57) ABSTRACT

The disclosure provides a display device, including a main power supply channel and an external power supply channel. The main power supply channel includes a main power input interface, a main power conversion module, and a main function module. The main power input interface is connected to the main power conversion module. The main power conversion module is connected to the main function module. The main power input interface is configured to receive main input power. The external power supply channel includes an external power input interface and an external power output interface. The external power input interface is connected to the external power output interface. The external power input interface is configured to receive external input power. The external power output interface is configured to output external output power.

10 Claims, 4 Drawing Sheets

DISPLAY DEVICE

CROSS-REFERENCE TO RELATED APPLICATION

This application claims the priority benefit of Taiwan Application Serial No. 107216378, filed on Nov. 30, 2018. The entirety of the above-mentioned patent application is hereby incorporated by reference herein and made a part of the specification.

BACKGROUND OF THE INVENTION

Field of the Invention

The disclosure relates to a display device, and in particular, to a display device including a plurality of power supply channels.

Description of the Related Art

To make it easy for users to carry, portable electronic devices such as smart phones or notebook computers are designed into a lightweight and thin structure, in which, the screen size is small. A user often connects a portable electronic device to a display device to display an image of the portable electronic device through the large-size display device at home or in an office. When connected to the display device, the portable electronic device not only transmits audio/video information but also is charged through the display device. To meet this requirement, an existing display device is generally equipped with a power supply having high-power to supply power to both the display device and such an external device. However, the power supply with high-power not only affects the overall appearance of the display device, but also generates a large amount of heat, reducing the service life of electronic components in the display device.

BRIEF SUMMARY OF THE INVENTION

According to the first aspect of the disclosure, a display device is provided. The display device includes: a main power supply channel, comprising a main power input interface, a main power conversion module, and a main function module, wherein the main power input interface is connected to the main power conversion module, the main power conversion module is connected to the main function module, and the main power input interface receives main input power; and an external power supply channel, comprising an external power input interface and an external power output interface, wherein the external power input interface is connected to the external power output interface, the external power input interface is configured to receive external input power, and the external power output interface is configured to output external output power.

Based on the above, the display device according to the embodiments of the disclosure supplies enough power to an external device by the design of the main power supply channel and the external power supply channel without increasing the power and size of a built-in power supply of the display device, thereby making the display device thinner and lighter. In addition, the design of the external power supply channel corresponds to power required by different external devices, thus increasing the flexibility in use of the display device.

The detailed descriptions of other effects and embodiments of the disclosure are provided below with reference to the accompanying drawings.

BRIEF DESCRIPTION OF THE DRAWINGS

To more clearly describe the technical solutions in the embodiments of this application or in the prior art, the following will briefly introduce the drawings required for describing the embodiments or the prior art. It is apparent that the drawings in the following description are only some embodiments described in this application, and a person of ordinary skill in the art may obtain other drawings on the basis of these drawings without any creative effort.

DETAILED DESCRIPTION OF THE EMBODIMENTS

Figure 1:
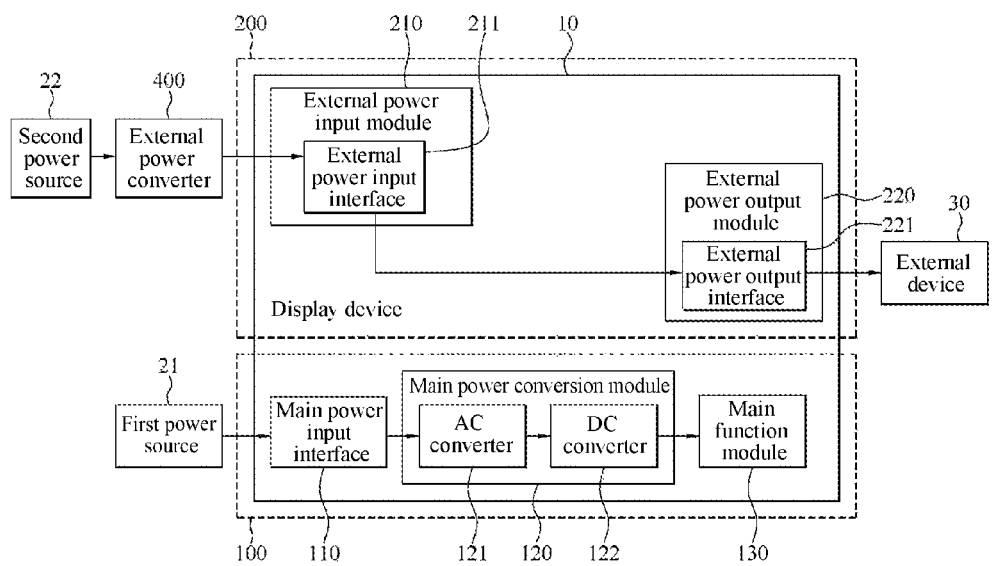
FIG. 1 is a schematic block diagram of a display device according to a first embodiment of the disclosure.
Figure 2:
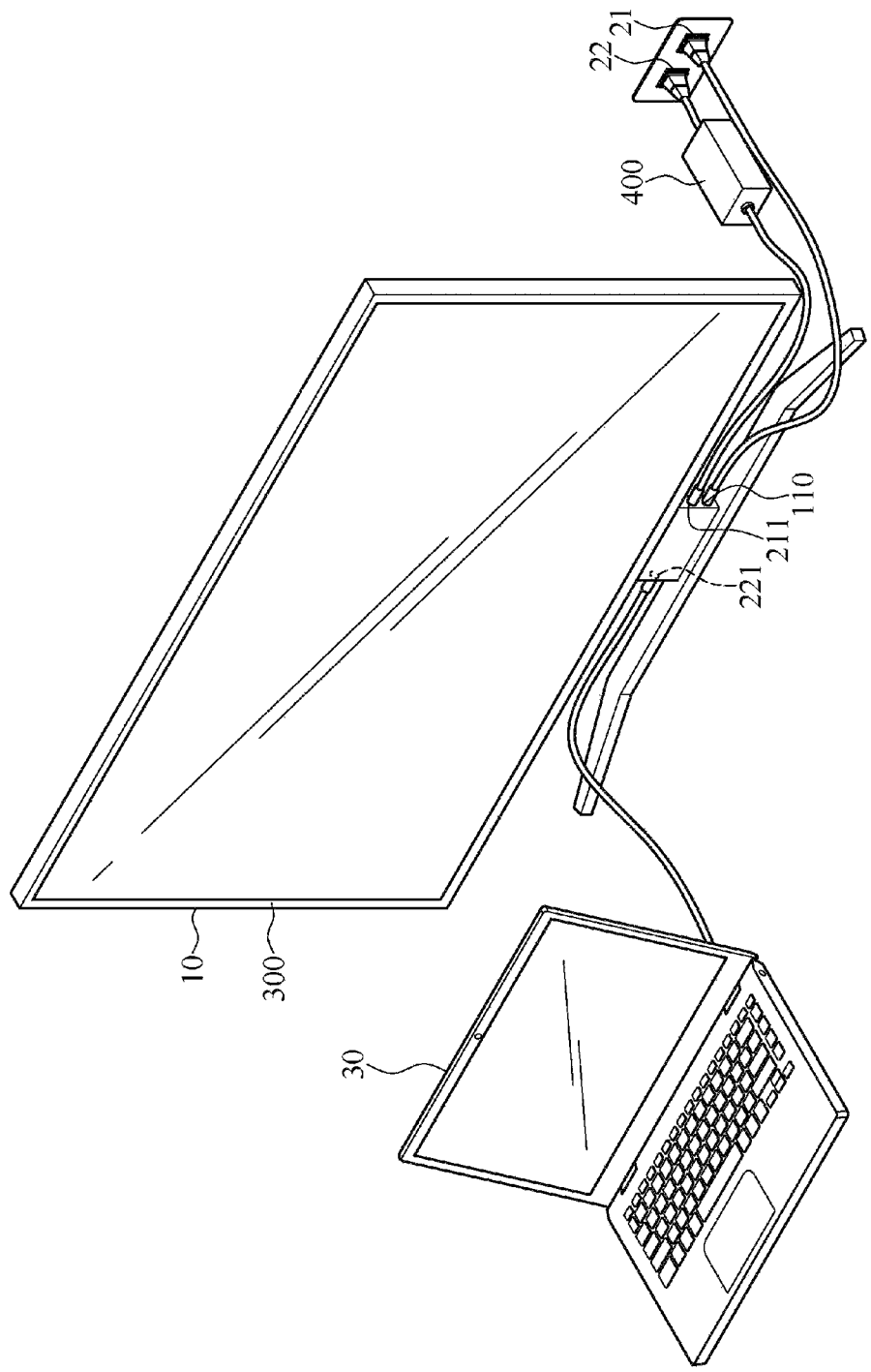
FIG. 2 is a schematic diagram of the display device shown in FIG. 1.

Referring to FIG. 1 and FIG. 2, in this embodiment, a display device 10 is a desktop computer screen. In some other embodiments, the display device 10 is a smart television or a projector. As shown in FIG. 1 and FIG. 2, in this embodiment, the display device 10 includes a main power supply channel 100, an external power supply channel 200, and a housing 300. The main power supply channel 100 includes a main power input interface 110, a main power conversion module 120, and a main function module 130. The main power input interface 110 is connected to the main power conversion module 120. The main power conversion module 120 is connected to the main function module 130. The main power input interface 110 includes a socket disposed on the housing 300. An end of a corresponding power cable is inserted into the socket of the main power input interface 110, and the other end is connected to a first power source 21. In an embodiment, the first power source 21 is a socket connected to a mains network. In some other embodiments, the main power input interface 110 includes a power cable. An end of the power cable is fastened to the housing 300 and extends outward, and the other end is connected to the first power source 21.

As shown in FIG. 1, in this embodiment, the main power conversion module 120 includes an alternating-current (AC) converter 121 and a direct-current (DC) converter 122. The main power input interface 110 is connected to the AC converter 121, the AC converter 121 is connected to the DC converter 122, and the DC converter 122 is connected to the main function module 130. The first power source 21 supplies power, the main power input interface 110 is configured to receive the power (referred to as main input power below), and the main input power is further converted to suitable internal operating power by the main power conversion module 120. In an embodiment, the AC converter 121 is an AC-DC convertor configured to convert an AC to a DC. In an embodiment, the DC converter is a DC-DC convertor configured to convert a DC of a particular voltage to a DC of a different voltage. In an embodiment, the main input power is a 110-volt AC. After passing through the main power input interface 110, the 110-volt AC is converted to a DC by the AC converter 121; then, the DC is converted to DCs of various voltages including 5 volts, 10 volts and 12 volts by the DC converter 122. The DCs of different voltages are supplied to electronic components in the main function module 130. The main function module 130 is a generic term designated to all the modules with various functions in the display device 10. In an embodiment, the main function module 130 includes at least one of a display panel module, a backlight module, a control chip, a circuit or a key. To be specific, the main power supply channel 100 is configured to supply power for operation of the display device 10.

As shown in FIG. 1 and FIG. 2, in this embodiment, the external power supply channel 200 includes an external power input module 210 and an external power output module 220. The external power input module 210 includes an external power input interface 211, the external power output module 220 includes an external power output interface 221, and the external power input interface 211 is connected to the external power output interface 221. The external power input interface 211 and the external power output interface 221 are respectively arranged on the housing 300. In an embodiment, the external power input interface 211 and the external power output interface 221 respectively include corresponding sockets arranged on the housing 300. In an embodiment, an end of a power cable is inserted into the socket of the external power input interface 211, and the other end is connected to a second power source 22. In an embodiment, the second power source 22 is a socket connected to a main network. The external power input interface 211 is configured to receive power (referred to as external input power below) from the second power source 22. In an embodiment, an end of a transmission cable is inserted into the socket of the external power output interface 221, and the other end is inserted into an external device 30. The external power output interface 221 is configured to supply power (referred to as external output power below) to the external device 30.

As shown in FIG. 1 and FIG. 2, in this embodiment, an external power converter 400 is an AC-DC adaptor connected to the display device 10. An end of the external power converter 400 is connected to the external power input interface 211 through a power cable, and the other end is connected to the second power source 22 through a power cable. The second power source 22 supplies power to the external power converter 400, the external power converter 400 converts the power to external input power, the external power input interface 211 receives the external input power and transmits the external input power to the external power output interface 221, and the external power output interface 221 outputs the external output power to the external device 30 based on the received external input power. In an embodiment, the external power converter 400 is a power converter applicable to the external device 30. Therefore, in this embodiment, the power is converted directly by the external power converter 400 to a power specification required by the external device 30 (that is, the external input power and the external output power are of the same specification), to supply power to the external device 30 connected to the display device 10. In this way, no power conversion module corresponding to the power or power specification of the external device 30 needs to be arranged additionally in the display device 10, and the display device 10 only needs to supply the power received from the external power converter 400 to the external device 30 through the external power supply channel 200. In an embodiment, the external device 30 is a notebook computer, and the external power converter 400 is a power conversion module applicable to the notebook computer. The external power converter 400 adjusts output power based on a preset setting or a user setting, so that the power supplied by the second power source 22 is converted to power suitable for operation of the notebook computer through the external power converter 400.

In an embodiment, the external power input interface 211 and the external power output interface 221 are universal serial bus type-c (USB-C) interfaces, and an input/output interface of the external device 30 is also a USB-C interface. USB-C supports both data transmission and the USB Power Delivery (USB-PD) communications protocol. Therefore, cable and input/output interface of USB-C support transmission of both signals and power. In this embodiment, the external power output interface 221 includes a USB-C socket. The external power output interface 221 of the display device 10 is connected to the external device 30 through a USB-C transmission cable inserted in the USB-C sockets. In this way, the display device 10 supplies power to the external device 30 through the transmission cable. In another embodiment, the external power converter 400 is a power delivery (PD) adaptor and supporting a power delivery function of USB-C. In this embodiment, the external power converter 400 receives a 110-volt AC from the second power source 22, and then converts the 110-volt AC to a DC of a particular voltage required by the external device 30. The external power supply channel 200 outputs the DC of the particular voltage to the external device 30.

In some embodiments, the external power converter 400 is a power adapter accessorizing the external device 30. In an embodiment, a commercially available notebook computer is equipped with a dedicated power adapter, and the notebook computer is connected to a power source through the dedicated power adapter to obtain power. When the notebook computer as the external device 30 is connected to the display device 10, the dedicated power adapter of the notebook computer serves as the external power converter 400 of the display device 10. In other embodiments, the external device 30 is a smart phone, and the external power converter 400 is a dedicated power adapter of the mobile phone. In this way, no matter the display device 10 is connected to which type of external device 30, the external power supply channel 200 provides suitable power, improving flexibility and convenience in use.

Figure 3:
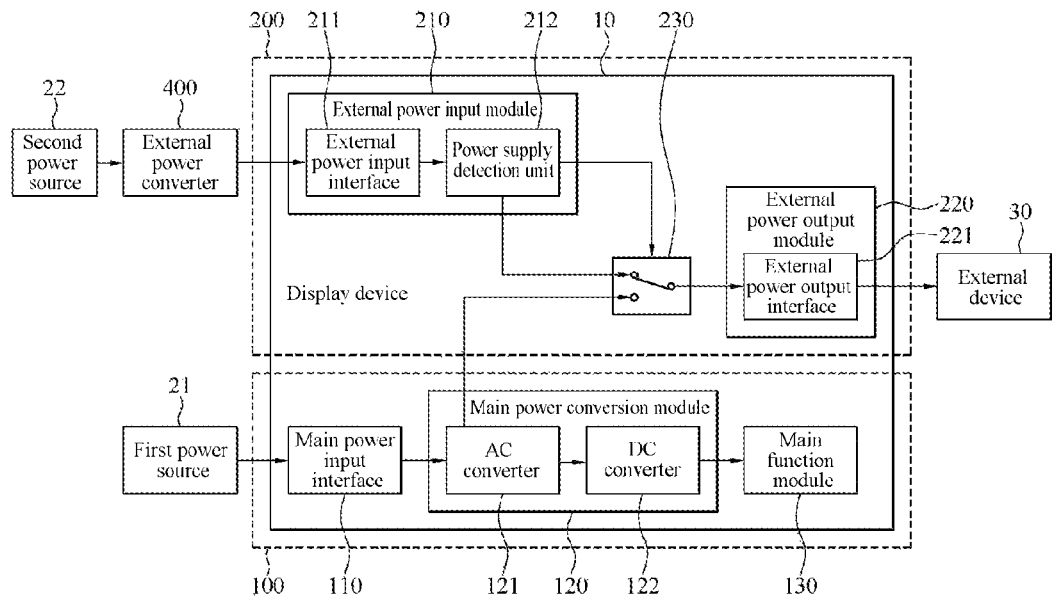
FIG. 3 is a schematic block diagram of a display device according to a second embodiment of the disclosure.

Referring to FIG. 3, a main difference between a display device 10 in FIG. 3 and the display device 10 in FIG. 1 is that the display device 10 in FIG. 3 further includes a power supply detection unit 212 and a power supply channel switcher 230. For other same or similar components and corresponding connection relationships, reference is made to the foregoing embodiments, and the details are not described herein again. As shown in FIG. 3, in this embodiment, the external power input module 210 of the external power supply channel 200 of the display device 10 further includes the power supply detection unit 212, and the external power supply channel 200 further includes the power supply channel switcher 230. The external power input interface 211 is electrically connected to the power supply channel switcher 230 through the power supply detection unit 212. The power supply channel switcher 230 is configured to selectively connect the external power output interface 221 to the external power input module 210 or the main power conversion module 120. In an embodiment, the power supply detection unit 212 transmits a first switching signal, to cause the power supply channel switcher 230 to connect the external power input interface 211 of the external power input module 210 and the external power output interface 221 of the external power output module 220. In this case, the main power conversion module 120 is disconnected from the external power output module 220. In another embodiment, the power supply detection unit 212 transmits a second switching signal, to cause the power supply channel switcher 230 to connect the main power conversion module 120 and the external power output interface 221 of the external power output module 220. In this case, the external power input module 210 is disconnected from the external power output module 220.

In an embodiment, when the power supply detection unit 212 detects external input power, the power supply channel switcher 230 connects the external power input interface 211 of the external power input module 210 and the external power output interface 221 of the external power output module 220, so that the external input power inputted from the external power input module 210 is transmitted to the external device 30 through the external power output module 220. When the power supply detection unit 212 does not detect any external input power and the external device 30 is connected to the display device 10, the power supply detection unit 212 first determines whether main input power is sufficient for the external device 30 or not. When determining that the main input power is sufficient for the external device 30, the power supply detection unit 212 controls the power supply channel switcher 230 to connect the main power conversion module 120 and the external power output module 220. In this case, the display device 10 converts power supplied by the first power source 21 to power required by the external device 30 through the main power conversion module 120, and supplies the power to the external device 30 through the external power output module 220. In this embodiment, an end of the power supply channel switcher 230 is connected to the AC converter 121 of the main power conversion module 120. In other embodiments, the power supply channel switcher 230 is connected to the DC converter 122 of the main power conversion module 120.

Figure 4:
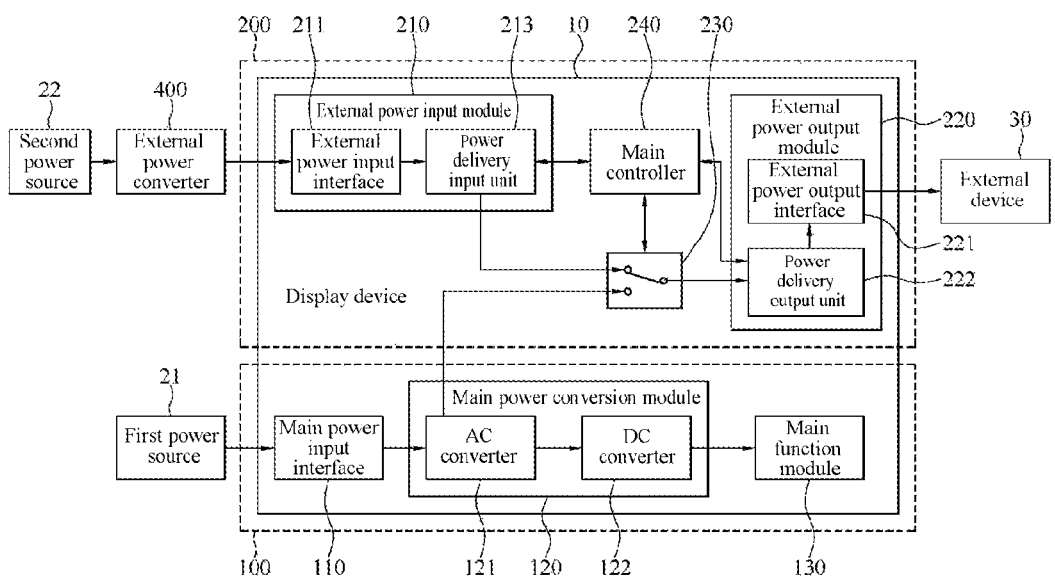
FIG. 4 is a schematic block diagram of a display device according to a third embodiment of the disclosure.

Referring to FIG. 4, a main difference between a display device 10 in FIG. 4 and the display device 10 in FIG. 1 is that the external power input module 210 in FIG. 4 further includes a power delivery input unit 213, the external power output module 220 further includes a power delivery output unit 222, and the external power supply channel 200 further includes a power supply channel switcher 230 and a main controller 240. For other same or similar components and corresponding connection relationships, reference is made to the foregoing embodiments, and the details are not described herein again. In this embodiment, the power delivery input unit 213 and the power delivery output unit 222 are USB-PD units. The main controller 240 is electrically connected to the power supply channel switcher 230, the power delivery input unit 213, and the power delivery output unit 222. The power delivery input unit 213 is connected to the external power input interface 211, and the power delivery output unit 222 is connected to the external power output interface 221. The power supply channel switcher 230 selectively connects the power delivery output unit 222 to the power delivery input unit 213 of the external power input module 210 or the main power conversion module 120. In an embodiment, the main controller 240 transmits a first switching signal, to cause the power supply channel switcher 230 to connect the external power input module 210 and the external power output module 220. In this case, the main power conversion module 120 is disconnected from the external power output module 220. In another embodiment, the main controller 240 transmits a second switching signal, to cause the power supply channel switcher 230 to connect the main power conversion module 120 and the external power output module 220. In this case, the external power input module 210 is disconnected from the external power output module 220.

In this embodiment, the external power input interface 211 and the external power output interface 221 are USB-C interfaces, and the power delivery input unit 213 and the power delivery output unit 222 are USB-PD units. In this embodiment, the main controller 240 controls the power supply channel switcher 230 based on whether the power delivery input unit 213 detects external input power or not, and controls the power delivery output unit 222 to output external output power required by the external device 30. In an embodiment, the power delivery input unit 213 includes a memory, and the power delivery input unit 213 stores all power specifications supported by the external power converter 400 in the memory. The main controller 240 reads the power specifications supported by the external power converter 400 from the power delivery input unit 213 and stores the power specifications in the memory of the power delivery output unit 222. When the external device 30 is connected to the external power output interface 221, the power delivery output unit 222 notifies the external device 30 of the power specifications supported by the external power converter 400 and stored in the memory, so that the external device 30 selects a suitable power specification for power transmission from the power specifications. In an embodiment, the main controller 240 is a control chip dedicated to the external power supply channel 200. In another embodiment, the main controller 240 is a control chip with a function of controlling the external power supply channel 200 and is configured to control and process an internal signal of the display device 10, such as a micro control unit (MCU) chip, a system-on-a-chip (SOC), or a scaler chip. In this case, the main controller 240 is also connected to a main function module 130.

In an embodiment, when the main controller 240 detects the external input power through the power delivery input unit 213, the main controller 240 controls the power supply channel switcher 230 to connect the power delivery input unit 213 of the external power input module 210 and the power delivery output unit 222 of the external power output module 220, so that the external input power input from the external power input module 210 is transmitted to the external device 30 through the external power output module 220. When the power delivery input unit 213 does not detect any external input power, the main controller 240 controls the power supply channel switcher 230 to connect the main power conversion module 120 and the external power output module 220.

Figure 5:
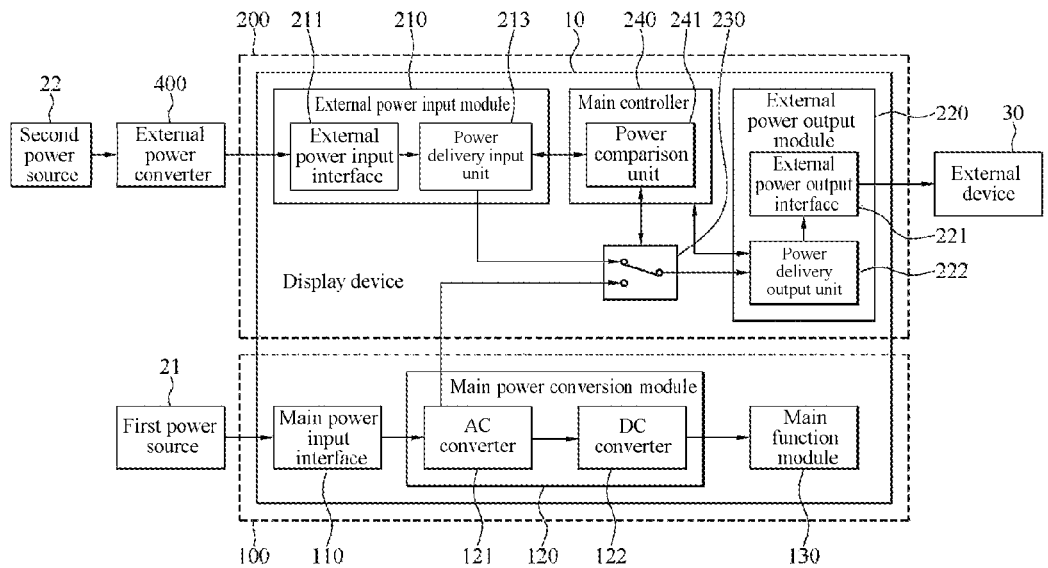
FIG. 5 is a schematic block diagram of a display device according to a fourth embodiment of the disclosure.

Referring to FIG. 5, a main difference between a display device 10 in FIG. 5 and the display device 10 in FIG. 4 is that the main controller 240 includes a power comparison unit 241. For other same or similar components and corresponding connection relationships, reference is made to the foregoing embodiments, and the details are not described herein again. As shown in FIG. 5, in this embodiment, when the main controller 240 detects the external input power and obtains relevant information (for example: input voltage or input power) of the external input power through the power delivery input unit 213, the power comparison unit 241 compares the input power rate of the external input power with a power rate threshold. In an embodiment, the power rate threshold is a maximum power value provided by the main power supply channel 100. In other embodiments, the power rate threshold is a remaining power value obtained by subtracting a maximum power value required by the main function module 130 from the maximum power value provided by the main power supply channel 100. In other embodiments, the power rate threshold is power required by the external device 30. When the power comparison unit 241 determines that the input power rate of the external input power is less than the power rate threshold, the main controller 240 controls the power supply channel switcher 230 to connect the main power conversion module 120 and the power delivery output unit 222 of the external power output module 220. When the power comparison unit 241 determines that the input power rate of the external input power is greater than or equal to the power rate threshold, the main controller 240 controls the power supply channel switcher 230 to connect the power delivery input unit 213 of the external power input module 210 and the power delivery output unit 222 of the external power output module 220.

In an embodiment, the external device 30 connected to the external power output interface 221 is a smart phone, and the external power converter 400 connected to the external power input interface 211 is a dedicated power adapter of the smart phone. Power required by the smart phone is much less than power required by the display device 10. In addition, power provided by the main power supply channel 100 of the display device 10 is sufficient for the main function module 130, and the remaining power exceeds the power required by the smart phone. Therefore, in this case, when the power comparison unit 241 determines that the input power rate of the external input power is less than the power rate threshold, the main controller 240 controls the power supply channel switcher 230 to connect the main power conversion module 120 and the external power output module 220, to be specific, the display device 10 supplies main input power to the external device 30.

In an embodiment, the external device 30 connected to the external power output interface 221 is a gaming notebook computer, and the external power converter 400 connected to the external power input interface 211 is a dedicated power adapter of the gaming notebook computer. Power required by the gaming notebook computer is quite high, and is not less than or is greater than the power required by the main function module 130 of the display device 10. Therefore, after the power provided by the main power supply channel 100 is supplied to the main function module 130, the remaining power is insufficient to provide the power required by the electronic-sports notebook computer. In this case, when the power comparison unit 241 determines that the input power rate of the external input power is greater than or equal to the power rate threshold, the main controller 240 controls the power supply channel switcher 230 to connect the external power input module 210 and the external power output module 220, to be specific, the display device 10 supplies the external input power to the external device 30.

Figure 6:
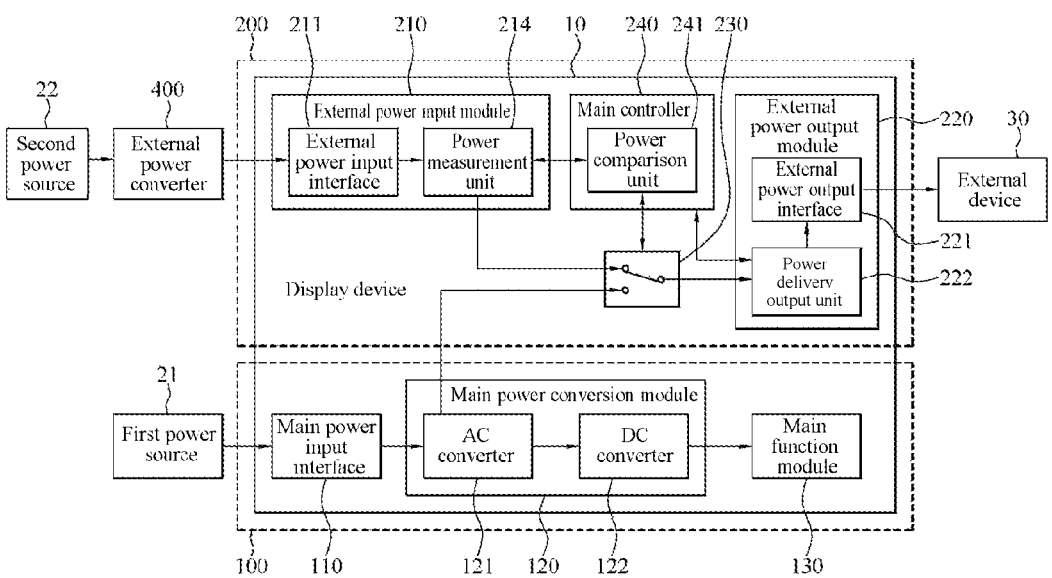
FIG. 6 is a schematic block diagram of a display device according to a fifth embodiment of the disclosure.

Referring to FIG. 6, the display device 10 in FIG. 6 uses a power measurement unit 214 to replace the power delivery input unit 213 of the display device 10 in FIG. 5. For other same or similar components and corresponding connection relationships, reference is made to the foregoing embodiments, and the details are not described herein again. As shown in FIG. 6, in this embodiment, the external power input module 210 includes the external power input interface 211 and the power measurement unit 214, and the main controller 240 is electrically connected to the power measurement unit 214, the power supply channel switcher 230, and the power delivery output unit 222. In this embodiment, the external power input interface 211 is a DC receptacle, and the external power converter 400 is an AC-DC adaptor. The external power converter 400 converts a 110-volt mains AC to a DC, and inputs the DC through the external power input interface 211.

As shown in FIG. 6, in this embodiment, the power measurement unit 214 is configured to measure a voltage or power of the external input power. When the external power input interface 211 inputs the external input power, the power measurement unit 214 measures input power of the external input power, and transmits the measured input power to the main controller 240. The power comparison unit 241 of the main controller 240 compares the input power rate with a power rate threshold. When the input power rate is less than the power rate threshold, the main controller 240 controls the power supply channel switcher 230 to connect the main power conversion module 120 and the power delivery output unit 222 of the external power output module 220. When the input power rate is greater than or equal to the power rate threshold, the main controller 240 controls the power supply channel switcher 230 to connect the external power input interface 211 of the external power input module 210 and the power delivery output unit 222 of the external power output module 220.

In an embodiment, the power measurement unit 214 includes a memory, and the power measurement unit 214 stores all power specifications supported by the external power converter 400 in the memory. The main controller 240 reads the power specifications supported by the external power converter 400 from the power measurement unit 214 and writes the power specifications in the memory of the power delivery output unit 222. When the external device 30 is connected to the external power output interface 221, the power delivery output unit 222 notifies the external device 30 of the power specifications supported by the external power converter 400 and stored in the memory, so that the external device 30 selects a suitable power specification for power transmission from the power specifications.

Based on the above, the display device according to the embodiments of the disclosure supplies enough power to an external device by the design of the main power supply channel and the external power supply channel without increasing the power and size of a built-in power supply of the display device, thereby making the display device thinner and lighter. In addition, the design of the external power supply channel corresponds to power required by different external devices, thus increasing the flexibility in use of the display device. Further, the display device automatically switches between different power supply paths according to input power, so as to adjust the supply of power more flexibly.

The above-described embodiments and/or implementations are merely illustrative of preferred embodiments and/or implementations for practicing the techniques of the disclosure, and are not intended to limit the embodiments of the techniques of the disclosure in any manner, and any person skilled in the art may make various variations or modifications to obtain other equivalent embodiments without departing from the scope of the technical means disclosed herein, and all such embodiments should still be considered to be substantially the same techniques or embodiments as the disclosure.

What is claimed is:

1. A display device, comprising:
a main power supply channel, comprising a main power input interface, a main power conversion module, and a main function module, wherein the main power input interface is connected to the main power conversion module, the main power conversion module is connected to the main function module, and the main power input interface receives main input power; and
an external power supply channel, comprising an external power input interface and an external power output interface, wherein the external power input interface is connected to the external power output interface, the external power input interface is configured to receive external input power, and the external power output interface is configured to output external output power.

2. The display device according to claim 1, wherein the external power supply channel further comprises a power supply detection unit and a power supply channel switcher, the power supply channel switcher is electrically connected to the power supply detection unit and the external power output interface, and the power supply channel switcher selectively connects the external power output interface to the external power input interface or the main power conversion module.

3. The display device according to claim 2, wherein when the power supply detection unit detects the external input power, the power supply detection unit controls the power supply channel switcher to connect the external power input interface and the external power output interface.

4. The display device according to claim 1, wherein the external power supply channel further comprises a power supply channel switcher, a main controller, a power delivery input unit, and a power delivery output unit, the main controller is electrically connected to the power supply channel switcher, the power delivery input unit, and the power delivery output unit, the power delivery input unit is connected to the external power input interface, the power delivery output unit is connected to the external power output interface, and the power supply channel switcher selectively connects the power delivery output unit to the power delivery input unit or the main power conversion module.

5. The display device according to claim 4, wherein when the main controller detects the external input power, the main controller controls the power supply channel switcher to connect the power delivery input unit and the power delivery output unit.

6. The display device according to claim 4, wherein the main controller comprises a power rate comparison unit, wherein when the main controller obtains input power rate of the external input power, the power rate comparison unit compares the input power rate with a power rate threshold, and when the input power rate is greater than or equal to the power rate threshold, the main controller controls the power supply channel switcher to connect the power delivery input unit and the power delivery output unit.

7. The display device according to claim 1, wherein the external power supply channel further comprises a power supply channel switcher, a main controller, a power delivery output unit, and a power measurement unit, the main controller comprises a power comparison unit, the main controller is electrically connected to the power supply channel switcher, the power measurement unit, and the power delivery output unit, the power measurement unit is connected to the external power input interface, the power delivery output unit is connected to the external power output interface, and the power supply channel switcher selectively connects the power delivery output unit to the power measurement unit or the main power conversion module.

8. The display device according to claim 7, wherein when the external power input interface receives the external input power, the power measurement unit measures input power rate of the external input power, and the power comparison unit compares the input power rate with a power rate threshold; and when the input power rate is greater than or equal to the, the power supply channel switcher connects the power delivery output unit and the power measurement unit.

9. The display device according to claim 7, wherein the external power input interface is a direct-current (DC) socket.

10. The display device according to claim 1, wherein, the external power input interface is a universal serial bus type-c (USB-C) interface.

* * * * *